United States Patent
Liu et al.

(10) Patent No.: US 11,664,260 B2
(45) Date of Patent: *May 30, 2023

(54) SYSTEMS AND METHODS FOR ORIENTATOR BASED WAFER DEFECT SENSING

(71) Applicant: Taiwan Semiconductor Manufacturing Co., Ltd., Hsin-Chu (TW)

(72) Inventors: Yan-Hong Liu, Zhudong Township, Hsinchu County (TW); Daniel M. Y. Yang, Hsin-Chu (TW); Che-Fu Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 113 days.

This patent is subject to a terminal disclaimer.

(21) Appl. No.: 17/227,079

(22) Filed: Apr. 9, 2021

(65) Prior Publication Data

US 2021/0225680 A1    Jul. 22, 2021

Related U.S. Application Data

(63) Continuation of application No. 15/941,585, filed on Mar. 30, 2018, now Pat. No. 10,978,331.

(51) Int. Cl.
| | |
|---|---|
| *H01L 21/68* | (2006.01) |
| *H01L 21/687* | (2006.01) |
| *G01N 21/95* | (2006.01) |
| *H01L 21/67* | (2006.01) |

(52) U.S. Cl.
CPC ....... *H01L 21/681* (2013.01); *G01N 21/9503* (2013.01); *G01N 21/9505* (2013.01); *H01L 21/67288* (2013.01); *H01L 21/68707* (2013.01); *H01L 21/68764* (2013.01)

(58) Field of Classification Search
CPC ............. H01L 21/681; H01L 21/67288; H01L 21/68707; G01N 21/9503; G01N 21/9505
USPC ...................................... 356/237.4
See application file for complete search history.

(56) References Cited

U.S. PATENT DOCUMENTS

| | | |
|---|---|---|
| 5,264,918 A | 11/1993 | Kagami |
| 6,045,716 A | 4/2000 | Walsh et al. |
| 6,414,752 B1 | 7/2002 | Sullivan et al. |
| 6,677,602 B1 | 1/2004 | Norton |
| 7,057,741 B1 | 6/2006 | Mueller et al. |
| 2003/0019583 A1 | 1/2003 | Kopacz et al. |
| 2003/0053039 A1 | 3/2003 | Nagai et al. |
| 2003/0193666 A1 | 10/2003 | Abraham et al. |
| 2004/0133298 A1 | 7/2004 | Toyserkani et al. |

(Continued)

FOREIGN PATENT DOCUMENTS

TW        200908184 A    2/2009

*Primary Examiner* — Tarifur R Chowdhury
*Assistant Examiner* — Omar H Nixon
(74) *Attorney, Agent, or Firm* — Duane Morris LLP

(57) ABSTRACT

In an embodiment, a system includes: an orientation sensor configured to detect an orientation fiducial on a bevel of a wafer; a pedestal configured to rotate the wafer to allow the orientation sensor to detect the orientation fiducial and place the orientation fiducial at a predetermined orientation position; and a defect sensor configured to detect a wafer defect along a surface of the wafer while rotated by the pedestal.

20 Claims, 11 Drawing Sheets

(56) References Cited

U.S. PATENT DOCUMENTS

| | | |
|---|---|---|
| 2005/0021177 A1 | 1/2005 | Bacchi et al. |
| 2005/0126314 A1 | 6/2005 | Hirata |
| 2005/0150451 A1 | 7/2005 | Tanaka et al. |
| 2005/0194535 A1 | 9/2005 | Noji et al. |
| 2005/0199807 A1 | 9/2005 | Watanabe et al. |
| 2005/0265814 A1 | 12/2005 | Coady |
| 2006/0115142 A1 | 6/2006 | Sim |
| 2006/0124873 A1 | 6/2006 | Anzai |
| 2007/0004058 A1* | 1/2007 | Lee ..................... H01L 21/681 438/14 |
| 2008/0013822 A1 | 1/2008 | Pai et al. |
| 2008/0030731 A1* | 2/2008 | Jin ..................... G01N 21/4738 356/417 |
| 2008/0068618 A1* | 3/2008 | Kagami ............... H01L 21/681 356/620 |
| 2008/0200100 A1 | 8/2008 | Takahashi et al. |
| 2008/0225281 A1* | 9/2008 | Komuro ............. G01N 21/9503 356/237.2 |
| 2008/0309927 A1 | 12/2008 | Grueneberg |
| 2009/0059236 A1 | 3/2009 | Meeks et al. |
| 2009/0103079 A1 | 4/2009 | Uto et al. |
| 2009/0122304 A1 | 5/2009 | Jin et al. |
| 2009/0161094 A1 | 6/2009 | Watkins |
| 2010/0177953 A1 | 7/2010 | Hayashi et al. |
| 2010/0285399 A1 | 11/2010 | Huang et al. |
| 2011/0141272 A1 | 6/2011 | Uto et al. |
| 2011/0150318 A1 | 6/2011 | Funakoshi et al. |
| 2012/0007978 A1 | 1/2012 | Passek et al. |
| 2012/0229794 A1 | 9/2012 | Roberts |
| 2012/0314211 A1 | 12/2012 | Ando et al. |
| 2013/0016206 A1 | 1/2013 | Zimmer et al. |
| 2015/0204822 A1 | 7/2015 | Horan et al. |
| 2015/0235881 A1 | 8/2015 | Adderly et al. |
| 2017/0084475 A1 | 3/2017 | Wagner et al. |
| 2017/0140963 A1 | 5/2017 | Kawasaki et al. |
| 2017/0200683 A1 | 7/2017 | Kim et al. |

\* cited by examiner

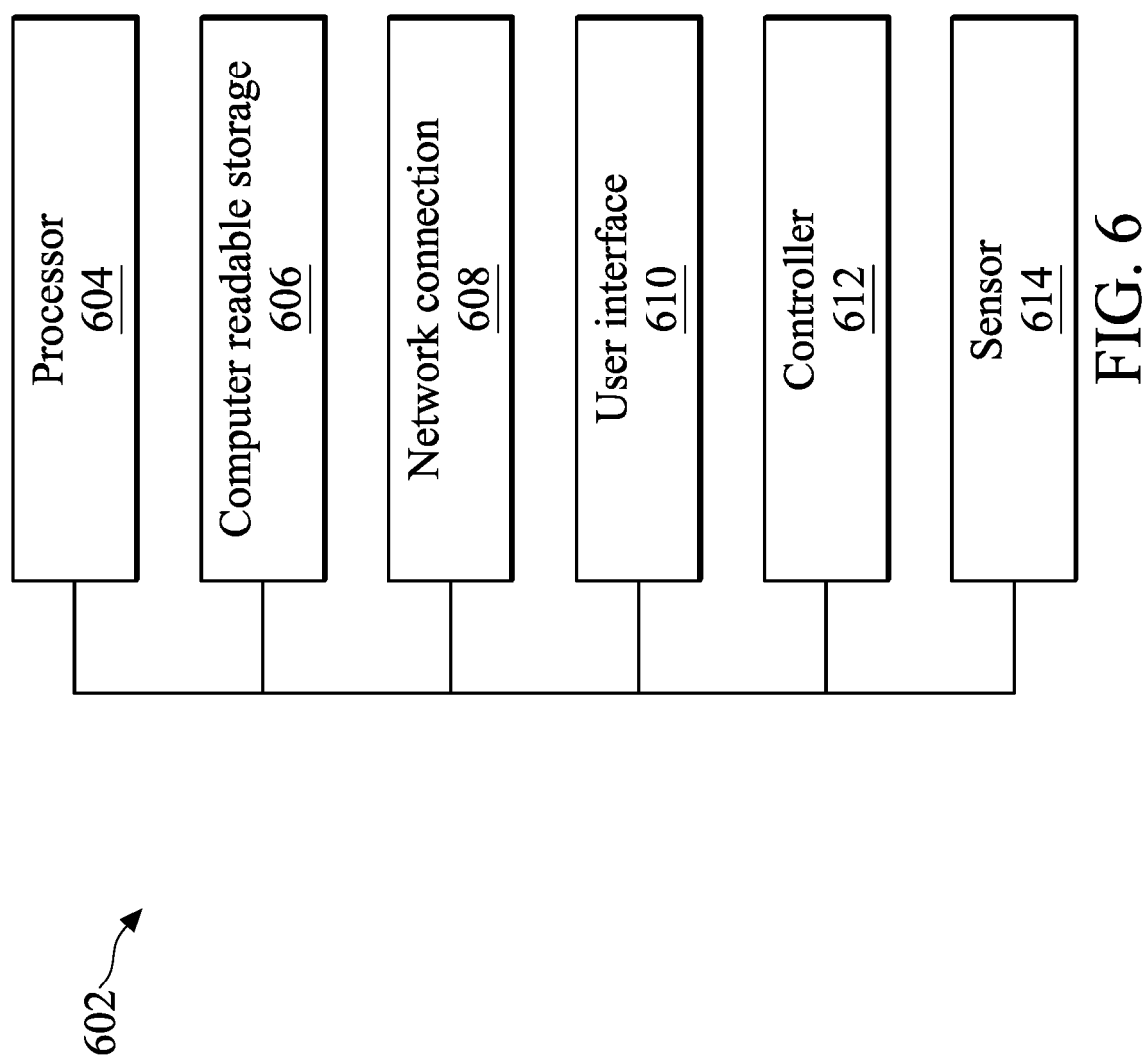

SYSTEMS AND METHODS FOR ORIENTATOR BASED WAFER DEFECT SENSING

CROSS-REFERENCE TO RELATED APPLICATION

This application is a continuation of U.S. patent application Ser. No. 15/941,585, filed Mar. 30, 2018, which is incorporated by reference herein in its entirety.

BACKGROUND

In the manufacture of integrated circuits, semiconductor substrates may loaded into various reaction and other processing chambers using automated equipment for processing. Typically, the automated equipment includes a robot or robotic arm that may transfer a wafer (e.g., semiconductor substrate or semiconductor workpiece), from a wafer pod that holds wafers through a central transfer chamber and into one or more processing chambers disposed in connection to the transfer chamber. The robotic arm is typically disposed in a central location in the transfer chamber to provide access to all of the chambers connected to the transfer chamber.

It may be desirable to calibrate a wafer relative to the robot, transfer chamber and/or process chamber so that the wafer can be processed and handled in a more optimal manner. For example, this may increase the effectiveness of the processing onto the precise desired surface area of the wafer to be processed. The detection of orientation fiducials may be utilized to indicate how a wafer is to be positioned for handling and processing. Although orientation fiducials may be utilized to calibrate the wafer's orientation to the optimum orientation for handling and processing, the wafer may still possess other defects that may require remediation to increase processing effectiveness. Therefore, conventional techniques of inspecting a wafer are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 6 is a block diagram of various functional modules of a defect sensor orientator system, in accordance with some embodiment.

DETAILED DESCRIPTION OF EXEMPLARY EMBODIMENTS

Figure 1A:
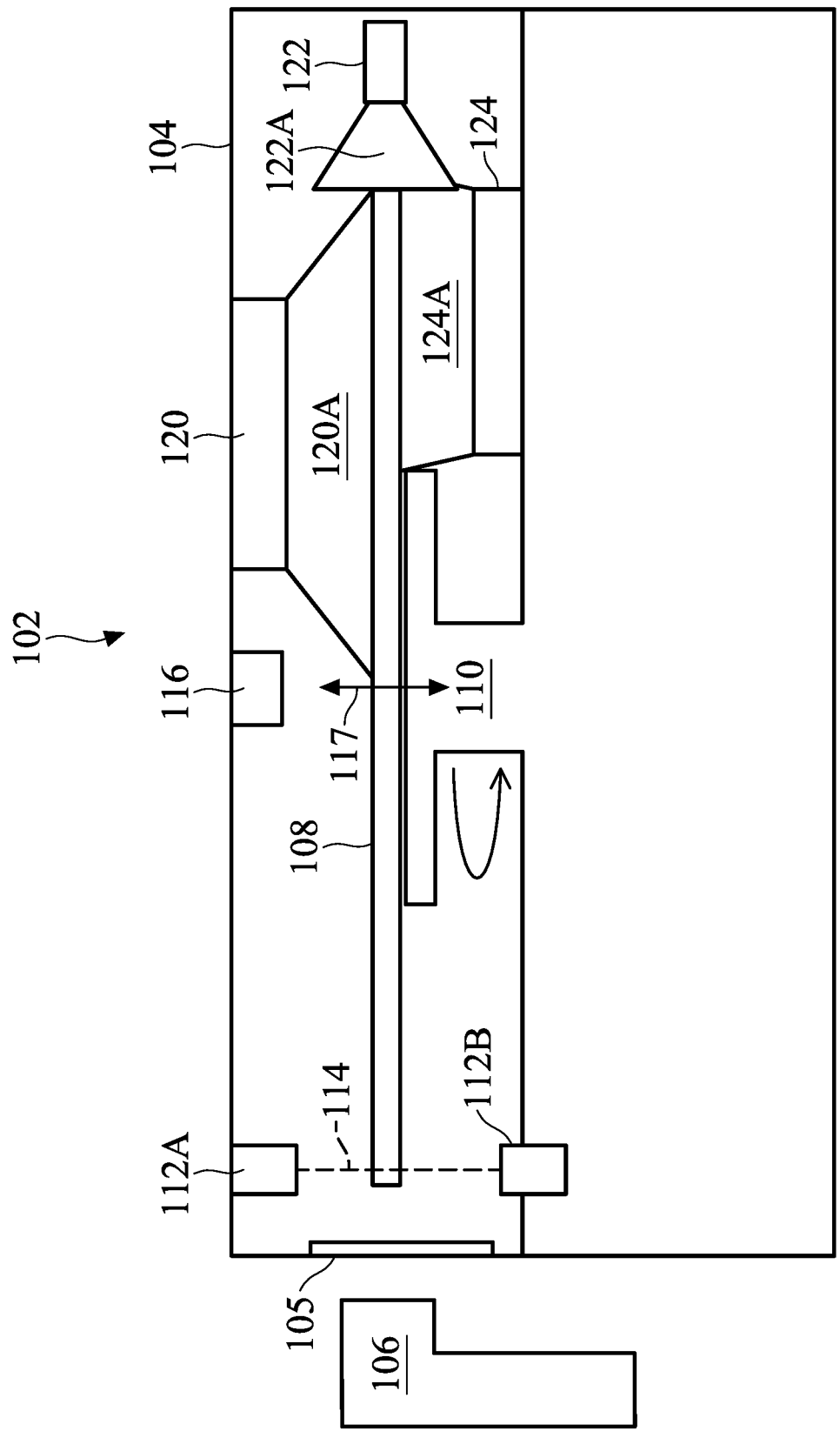
FIG. 1A is a cross sectional illustration of a defect sensor orientator, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As introduced above, wafers may be inspected and/or calibrated during processing to make sure that they are oriented properly during handling and processing. Tools utilized for such inspection and/or calibration may be referred to as an orientator. Orientators may utilize various conventional techniques to locate orientation fiducials, such as by rotating a wafer to determine the center and angular orientation of a wafer. Orientation fiducials may be any type of fiducial utilized to notate a wafer's orientation, such as a notch or a flat along a wafer's edge or bezel, or other identifiable feature of a wafer. The orientator may utilize a sensor, such as an optical sensor, to determine the location of the orientation fiducial and then reorient the wafer accordingly. In certain embodiments, distances between the center of rotation to the periphery of the wafer may be measured along a linear path so that a wafer center point offset may be calculated by geometric analysis of the measurements, and the wafer centered on an orientator by a robot or robotic arm.

Other than for orientation, wafers are traditionally not inspected while they are being processed. Rather, wafer inspection for wafer defects typically occurs after processing is completed by a workstation. However, during the course of transporting a wafer and/or processing a wafer in a processing chamber or workstation, a wafer may become damaged and/or unusable, wasting any further effort put into processing the wafer.

Accordingly, the present disclosure provides various embodiments of a defect sensor orientator. Defect sensor orientators may include a system which both orients a wafer and inspects the wafer for wafer defects along the wafer's surface. The orientator may include a pedestal on which a wafer may be moved (e.g., rotated) to inspect for both wafer fiducials and wafer defects along the surface of the wafer. In certain embodiments, the orientator may also utilize a robotic arm to position and/or reposition the wafer on the pedestal. Various types of sensors may be utilized for such inspections, such as optical sensors (e.g., a charge coupled device (CCD) or scanning electron microscope (SEM)). These optical sensors may detect radiation across the visible light non-visible light spectrum (e.g., the infrared spectrum). In certain embodiments, a single sensor may be utilized to inspect a wafer for wafer fiducials and wafer defects. In other embodiments, separate sensors may be utilized for wafer fiducial inspection and wafer defect inspection. Also, wafer defect sensors (e.g., defect sensors, or sensors configured for detection of wafer defects) may be disposed either, or a combination of, above, to the side (e.g., along a bezel) and/or under a wafer to be inspected. In certain embodiments, remediation may be performed when a wafer defect is detected. The remediation may include pausing the processing of the wafer pending a remediation (e.g., a fix) and/or removing the wafer from processing in favor of processing another wafer without the defect (e.g., a restart). Wafer defects may include any type of defect detectible by the defect sensor which may reduce wafer fabrication yield, such as a crack, discoloration, scratch, peel, and/or a chip on a wafer. Wafer defect detection may be accomplished through the utilization of wafer defect detection techniques, such as by the detection of non-uniformities, outliers, and/or variances as detected within collected sensor data from defect sensors.

In various embodiments, a wafer's bevel, or extreme edge around a wafer's circumference, may be assessed for defects utilizing a single, or multiple sensors. These sensors may be positioned around a wafer's edge so that various perspectives along a wafer's edge may be assessed, with sensor data collected which may be analyzed for wafer defect determination. For example, as sensor may collect sensor data at a 90 degrees location, 60 degrees location, 30 degrees location and/or 0 degree location, as will be discussed further below.

FIG. 1A is a cross sectional illustration of a defect sensor orientator 102, in accordance with some embodiments. The defect sensor orientator 102 may be within an orientation chamber 104 which may be closable to (e.g., with a door 105 that may open or close), or open to a transfer chamber that includes a robotic arm 106 configured to transfer a wafer 108 to and from the orientator 102. The robotic arm 106 may be a robotic arm for semiconductor workpiece processing that may manipulate (e.g., move) the wafer 108 within the robotic arm's work envelope (e.g., a three-dimensional shape that defines the boundaries that the robotic arm can reach and manipulate the wafer 108). The robotic arm 106 may be programmable to grasp, hold, and manipulate objects. In certain embodiments, the robotic arm 106 may be within the orientation chamber 104.

The defect sensor orientator 102 may include a rotatable pedestal 110. The robotic arm 106 may be configured to deposit the wafer 108 on the pedestal 110 (e.g., to be supported on the pedestal) and to reorient the wafer 108 (e.g., move it laterally toward or away from the pedestal 110). The rotatable pedestal 110 may be configured to be rotated, such as in a counterclockwise or clockwise direction around an axis of rotation 117. By rotating a wafer, an orientation sensor 112A, 112B may detect an orientation fiducial on the wafer 108. The orientation fiducial may be any type of fiducial to indicate a particular angular orientation of the wafer 108, such as a notch (e.g., a cut into the wafer 108 from the circumference of the wafer 108, such as in a "v" shape) or a flat (e.g., a straight portion of a wafer 108 bezel along an otherwise curved circumference). In certain embodiments, an orientation sensor 112A, 112B may include an emitter and detector pair in which an emitter 112A (alternatively, 112B) emits detectible radiation 114 (e.g., a laser beam) which is detected by a detector 112B (alternatively, 112A). For example, the radiation may be detectible only at a location along the wafer's bezel where there is an orientation fiducial, such as a notch or a flat. In particular embodiments, the defect sensor orientator 102 may also include a center sensor 116, which may detect whether the wafer 108 is centered on the pedestal 110, such as at an axis of rotation 117. For example, the center sensor 116 may be configured to detect a location of a center fiducial (e.g., a fiducial or a landmark at a center of a wafer 108 distinguishable by, for example, shape, texture, or color) or may be determined to determine distances between the center of rotation to the periphery of the wafer 108 along a linear path so that a wafer 108 center point offset may be calculated by geometric analysis of the measurements.

The defect sensor orientator 102 may also include at least one defect sensor 120, 122, 124. For example, a top defect sensor 120 may be configured to detect wafer defects along a top of the wafer 108 (e.g., within a scanning region 120A of the top defect sensor 120). A bevel defect sensor 122 may be configured to detect wafer defects along a side or bevel of the wafer 108 (e.g., within a scanning region 122A of the bevel defect sensor 122). A bottom defect sensor 124 may be configured to detect wafer defects along a bottom of a wafer 108 (e.g., within a scanning region 124A of the bottom defect sensor 124). In certain embodiments, the scanning regions of these sensors may overlap, such as an overlap between the scanning region 124A of the bottom defect sensor 124 and the scanning region 122A of the bevel defect sensor 122. In particular embodiments, the scanning regions may refer to a field of view, such as where the defect sensors 120, 122, 124 are optical sensors (e.g., a charge coupled device (CCD), complementary metal-oxide-semiconductor (CMOS) or N-type metal-oxide semiconductor (NMOS) image sensors). In additional embodiments, the defect sensors 120, 122, 124 may be a scanning electron microscope (SEM) or other type of sensor that may be utilized to detect defects along a surface of the wafer 108.

In further embodiments, different types of defect sensors may be at different defect sensor orientations (e.g., top, bevel, or bottom). For example, the top defect sensor 120 and the bottom defect sensor 124 may be one type of optical sensor (e.g., a CCD) while the bevel defect sensor 122 may be another type of optical sensor (e.g., a SEM).

In certain embodiments, the rotatable pedestal 110 may be configured to be rotated, such as in a counterclockwise or clockwise direction around an axis of rotation while both the orientation sensor 112A, 112B and the defect sensors 120, 122, 124 are inspecting the wafer simultaneously. However, in certain embodiments, the rotatable pedestal 110 may be operated for the purpose of the orientation sensor's 122A, 122B search for the orientation fiducial and separately (e.g., at a separate time) for the purpose of the defect sensor's 120, 122, 124 search for a wafer defect. Also, the rotatable pedestal may be configured for both constant rotation (e.g., rotating at a consistent speed without stopping) or intermittent rotation (e.g., rotating with intermittent stops that allow a defect sensor to capture sensor data of a still wafer 108 at the intermittent stops).

In various embodiments, the various sensors may be fixed within the orientation chamber 104. For example, the defect sensors 120, 122, 124 may be fixed relative to the pedestal 110. Also, the defects sensors 120, 122, 124 may be fixed relative also to the orientation sensor 112A and/or the center sensor 116.

In additional embodiments, a defect sensor 120, 122, 124 may be moved to scan across an area. Accordingly, for these embodiments, the blocks representing the defect sensors 120, 122, 124 may represent an envelope of space that may be occupied by a movable defect sensor 120, 122, 124. This scanning technique may be performed using a defect scan platform (e.g., part of the defect sensor 120, 122, 124) that may move a defect sensor 120, 122, 124 in one degree of freedom. An example of a defect scan platform may include a rail along which a defect sensor is configured to move. Also, the pedestal 110 may move the wafer 108 in another degree of freedom. For example, the pedestal 110 may provide rotational movement for the wafer 108 and a defect scan platform may move a defect sensor (e.g., a top defect sensor 120 or bottom defect sensor 124) across a lateral axis (e.g., across a radius of the wafer 108). Similarly, a defect scan platform may move a bevel defect sensor 122 across a vertical axis (e.g., across a thickness of the wafer 108 or along the bevel of the wafer).

As introduced above, wafer defects may include any type of defect detectible by the defect sensor which may reduce wafer fabrication yield, such as a crack, discoloration, scratch, peel, and/or a chip on a wafer. Wafer defect detection may be accomplished through the utilization of wafer defect detection techniques, such as by the detection of non-uniformities, outliers, and/or variances as detected within collected sensor data. Accordingly, a wafer defect may be detected as a particular type or amount of unexpected variance or non-uniformity along the wafer. Wafer defect detection may be implemented by a wafer defect detection system, that includes the defect sensor orientator 102, as will be discussed further below. For example, wafer defect detection techniques may assess image data (e.g., image data of multiple images, or a video) captured of a wafer as the wafer spins. Accordingly, the image data may be from multiple images of a same or different wafers across a continuous or discontinuous time frame. Different frames (e.g., images) of the image data may be compared to determine the presence of defects as abnormalities or outliers in the image data. For example, edge detection, thresholding, color based segmentation, or other types of image segmentation techniques may be utilized to find various features in the image data. Then, based on comparing the detected features, outliers in the data may be determined as possible wafer defects via supervised or unsupervised learning. The determination or definitions of outliers may be made in accordance with conventional statistical analysis for outliers. These outliers may be utilized as thresholds in the analysis of image data to determine image data that characterizes a wafer defect and image data that does not characterize a wafer defect. In certain embodiments, conventional wafer defect detection techniques may be utilized for the detection of wafer defects and thus will not be discussed in detail herein.

Figure 1B:
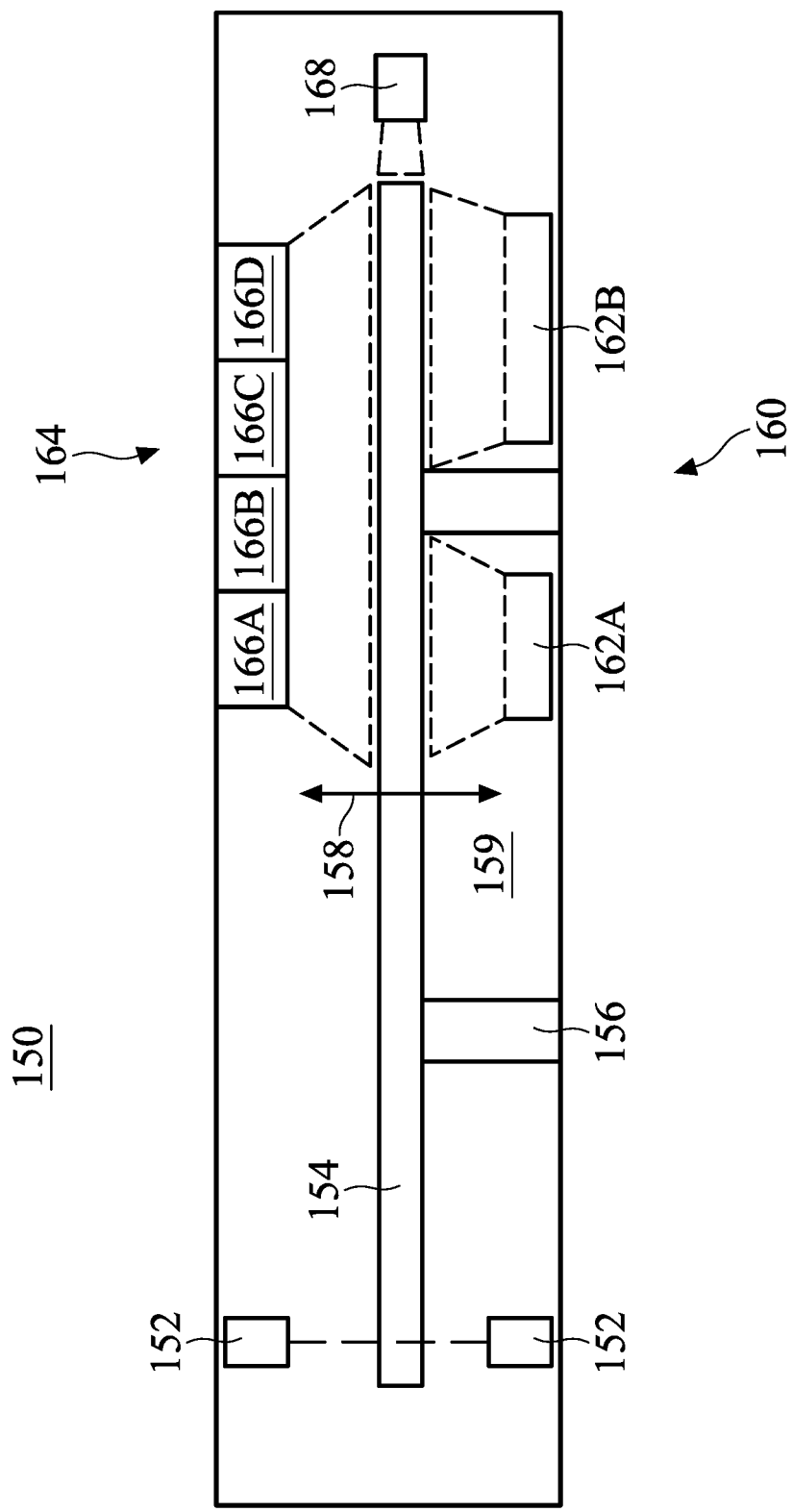
FIG. 1B is a cross sectional illustration of a defect sensor orientator with multiple defect sensors, in accordance with some embodiments.

FIG. 1B is a cross sectional illustration of a defect sensor orientator 150 with multiple defect sensors, in accordance with some embodiments. The defect sensor orientator 150 may include an orientation sensor 152 and wafer 154 similar to that discussed above. However, the pedestal 156 may be open (e.g., without a solid center portion close to the axis of rotation 158). Accordingly, more of the bottom of the wafer 154 may be accessible to bottom defect sensors 160 than in other types of defect sensor orientators, such as that illustrated with the earlier figure. Specifically, the pedestal 156 may have an opening 159. However, the pedestal 156 may still be configured to spin around the axis of rotation 158 to move or spin the wafer 154 around the axis of rotation 158. Among the bottom defect sensors 160, there may be a bottom defect sensor 162A configured to collect sensor data from within the opening 159.

There may be multiple bottom defect sensors 160 and multiple top defect sensors 164. Each of these defect sensors (e.g., either among the set of bottom defect sensors 160 or set of top defect sensors 164) may be a same or different type of defect sensor (e.g., a CCD or SEM). For example, among the bottom defect sensors 160, a first bottom defect sensor 162A may be a first type of defect sensor while the second bottom defect sensor 162B may be a second type of defect sensor. Alternatively, both of the bottom defect sensors 162A, 162B may be a same type of defect sensor. Similarly, among the top defect sensors 164, each of the constituent defect sensors 166A, 166B, 166C, 166D may be a same or different types of defect sensors. For example, 166A and 166C may be one type of defect sensor while 166B and 166D may be another type of defect sensor. The same type of arrangement may be utilized when the bevel defect sensor 168 may constitute multiple defect sensors (e.g., where different bevel defect sensors 168 may be a same type or different type of defect sensor). In certain embodiments, having multiple types of defect sensors within a defect sensor set (e.g., among top defect sensors, or among bottom defect sensors, or among bevel defect sensors) may yield more variety in terms of sensor data (e.g., due to the detection of different types of sensor data). Also, the different types of sensor data may cover a same or abutting region or area of a wafer, and be cross referenceable to offer more robust defect detection than if only a single type of sensor was utilized for a particular region or abutting regions of a wafer.

Furthermore, although defect sensors are illustrated as being on only one side of the axis of rotation 158, defect sensors may also be located at more than one side of the axis of rotation 158 as desired for different applications in various embodiments. For example, defect sensors may be located across a diameter of a wafer and across both sides of an axis of rotation.

Figure 2:
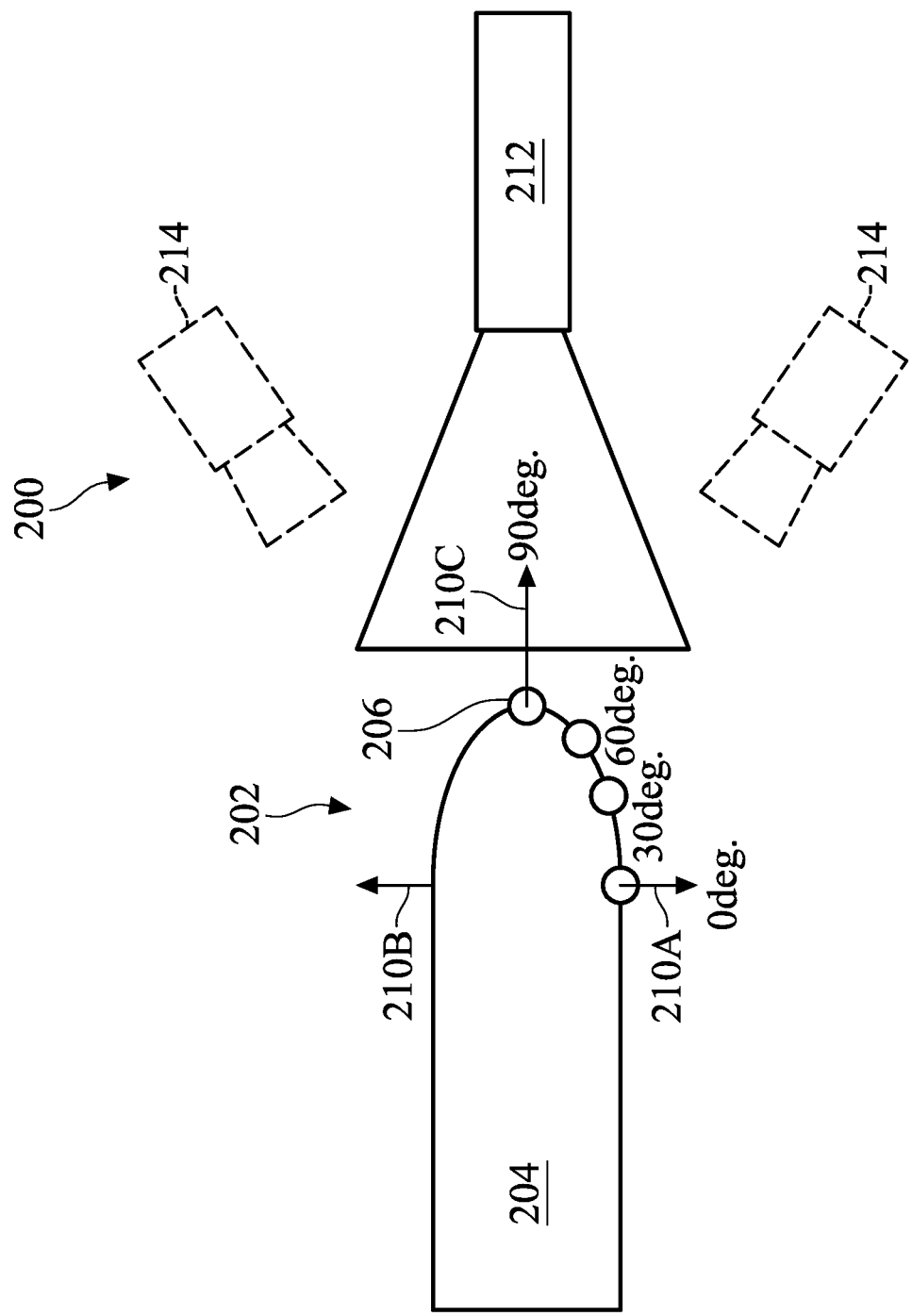
FIG. 2 is a cross sectional illustration of a bevel defect sensor, in accordance with some embodiments.

FIG. 2 is a cross sectional illustration of a bevel defect sensor 200, in accordance with some embodiments. As discussed above, a bevel 202 may refer to a side, or extreme edge of a wafer 204 extending horizontally and generally around the wafer's circumference. The bevel defect sensor 200 may be oriented around various positions around the bevel 202 vertically. For example, positions around a bevel may be notated in degrees, such as 0, 30, 60, 90, 120, 150, or 180 degrees, with either 0 or 180 degrees representing a transition from a curved bevel portion of a wafer to a flat top or bottom portion of a wafer. Also, the degrees notations may refer to a radial orientation of a line normal (e.g., a normal line) to the curve of the bevel. The line normal to a curve at a given point as referenced in degrees is the line perpendicular to the line that is tangent at a same point. Bevel defect sensor orientations between the 0 degree line normal 210A and 180 degrees line normal 210B may be referred to as bevel defect sensors. Stated another way, bevel defect sensors may be oriented to collect sensor data from a line normal angle between and including the 0 degree line normal 210A and the 180 degrees line normal 210B. For example, a line normal at a most extreme end or edge of a wafer may be a 90 degrees line normal 210C. A bevel defect sensor configured to collect sensor data when oriented from the 90 degree line normal may be referred to as a 90 degrees line normal bevel defect sensor 212. Other bevel defect sensors 214 may also be located at other line normals between the 90 degrees line normal 210C and the 0 degree line normal 210A or between the 90 degrees line normal 210C and the 180 degrees line normal 210B.

Figure 3:
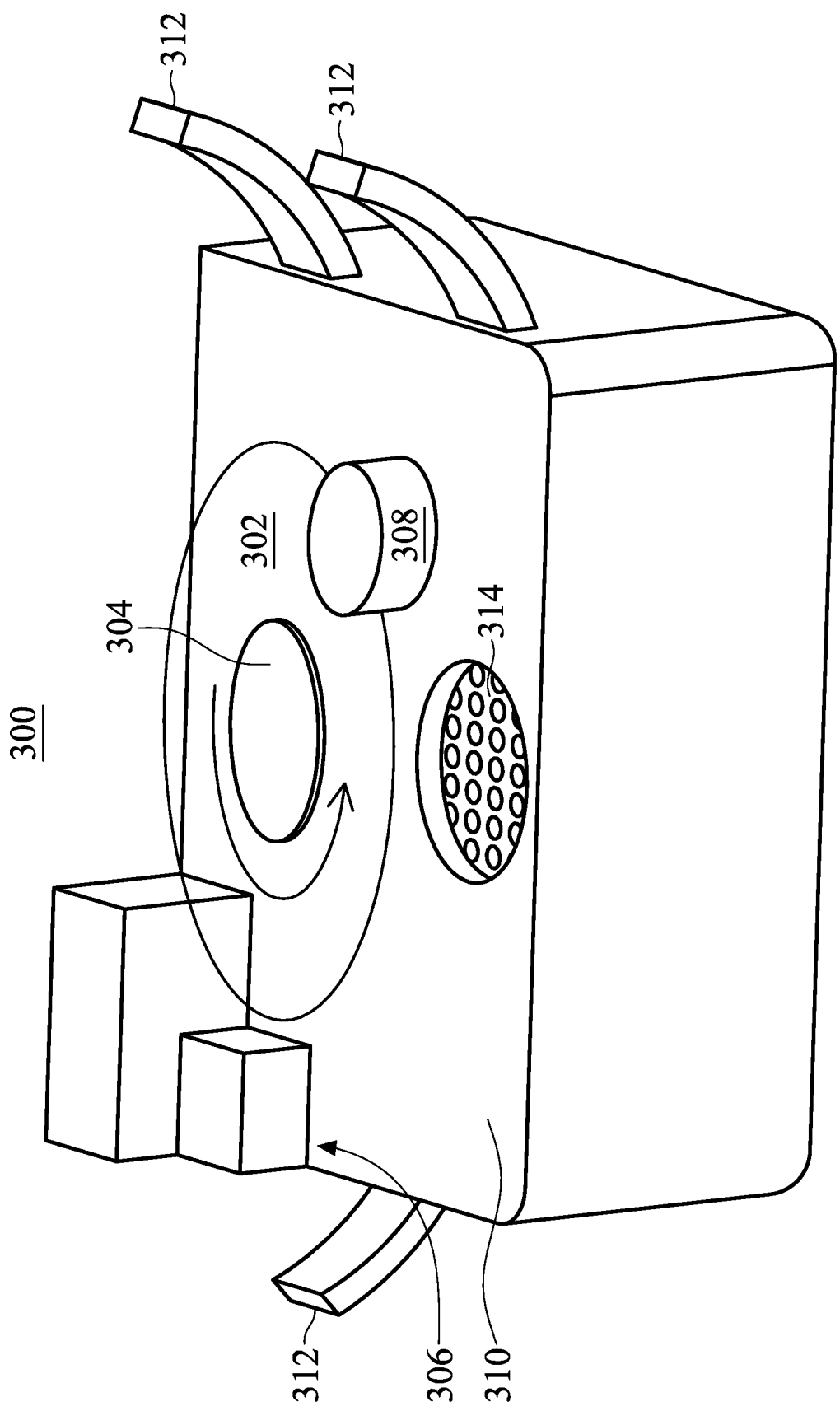
FIG. 3 is a perspective illustration of a defect sensor orientator, in accordance with some embodiments.

FIG. 3 is a perspective illustration of a defect sensor orientator 300, in accordance with some embodiments. The defect sensor orientator 300 may be configured to rotate a wafer 302 via a pedestal 304. The wafer 302 is illustrated with a degree of transparency to also illustrate the pedestal 304. The defect sensor orientator 300 may have an orientation sensor 306 and a defect sensor 308. The defect sensor orientator 300 may be substantially enclosed within a chamber formed when a top lid or enclosure (not illustrated) is secured to a base 310 on which the pedestal 304 also sits. The enclosure may be secured utilizing clamps 312. During operation, the pedestal 304 may rotate the wafer 302 to allow the orientation sensor 306 to detect an orientation fiducial along the bezel of the wafer 302. Also, the defect sensor 308 may be configured to collect sensor data characterizing the wafer 302. The sensor data may be utilized to determine whether defects are present on the wafer 302. In certain embodiments, a vent 314 may be present along the base 310 to provide the chamber with a degree of atmospheric control, such as by producing a suction of gas away from the wafer 302 or by importing a particular gas into the chamber.

Figure 4A:
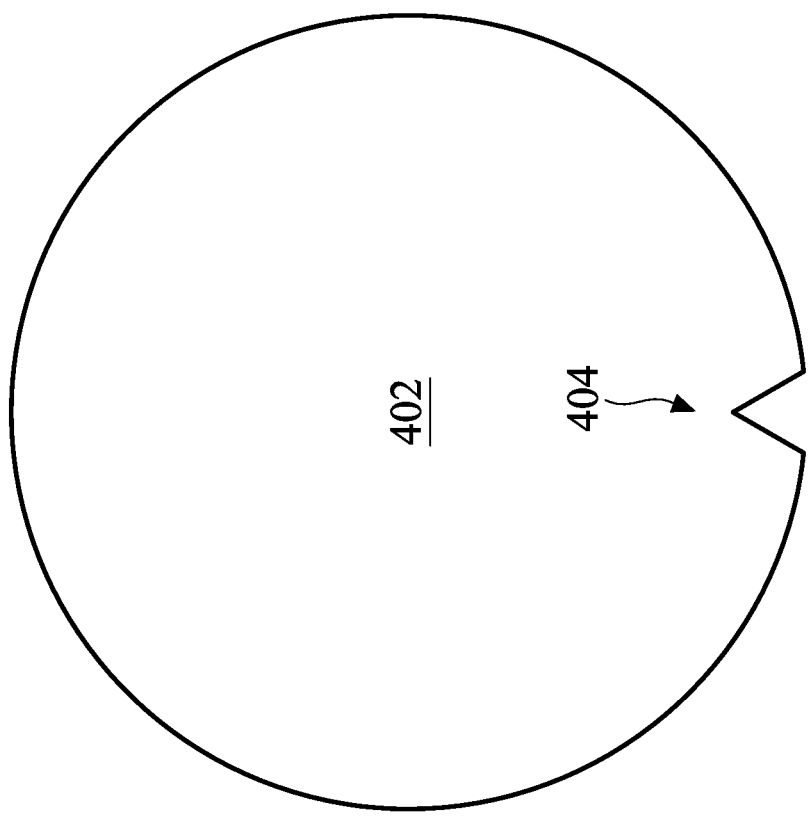
FIG. 4A is a top illustration of a defect sensor orientator relative to a wafer with a notch orientation fiducial, in accordance with some embodiments.

FIG. 4A is a top illustration of a defect sensor orientator relative to a wafer 402 with a notch orientation fiducial 404, in accordance with some embodiments. The notch orientation fiducial 404 may be a slight cut into the wafer 402 from the circumference of the wafer 402, such as in a "v" shape. Also, a bezel defect sensor 406 may be configured to collect sensor data that may character a wafer defect along the bezel of the wafer 402.

Figure 4B:
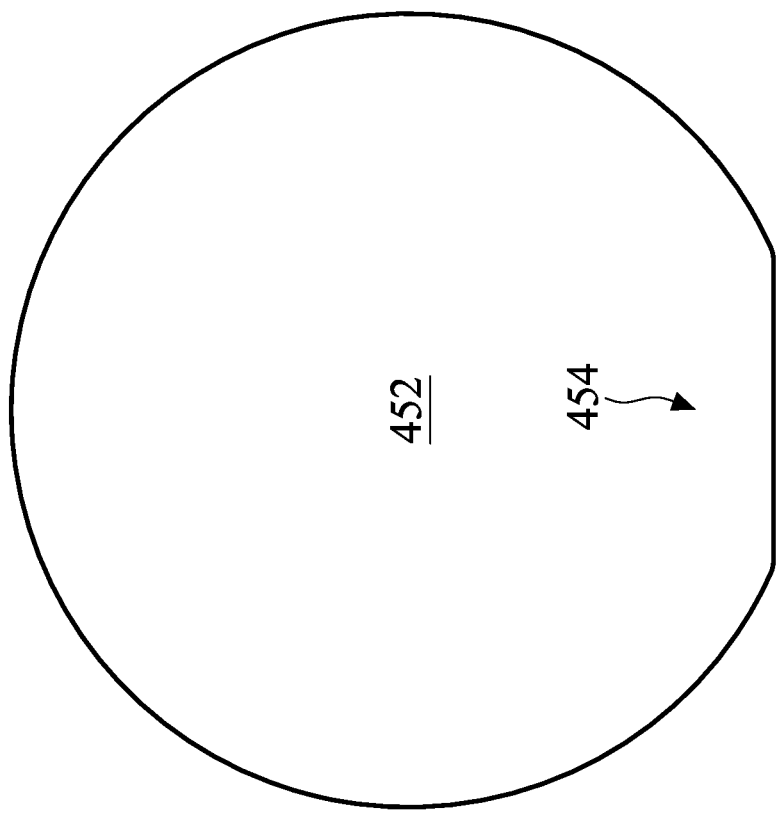
FIG. 4B is a top illustration of a defect sensor orientator relative to a wafer with a flat orientation fiducial, in accordance with some embodiments.

FIG. 4B is a top illustration of a defect sensor orientator relative to a wafer 452 with a flat orientation fiducial 454, in accordance with some embodiments. The flat orientation fiducial 454 may be a straight portion of a wafer 452 bezel along an otherwise curved circumference. Also, a bezel defect sensor 456 may be configured to collect sensor data that may character a wafer defect along the bezel of the wafer 452.

Figure 5A:
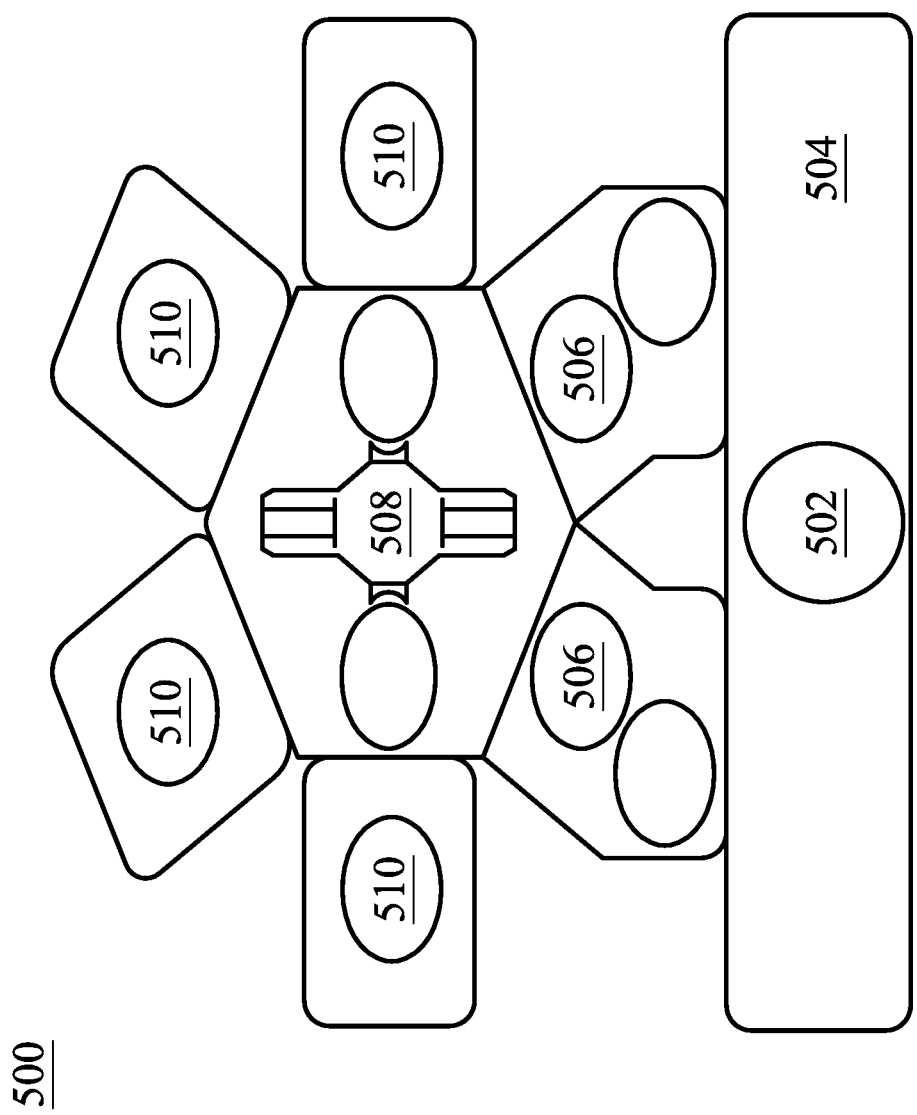
FIG. 5A is an illustration of a workstation with a defect sensor orientator centrally located in a transfer chamber, in accordance with some embodiments.

FIG. 5A is an illustration of a workstation 500 with a defect sensor orientator 502 centrally located in a first transfer chamber 504, in accordance with some embodiments. The workstation 500 may also include load ports 506, a second transfer chamber 508, and various semiconductor processing chambers 510. The first transfer chamber 504 may include a robotic arm and be configured to transfer wafers among the load ports 506 and the defect sensor orientator 502. The second transfer chamber 508 may include a robotic arm and be configured to transfer wafers among the semiconductor processing chambers 510 and the load ports 506. The robotic arms may be movable and/or extendable between the various load ports 506, semiconductor processing chambers 510 and/or defect sensor orientator 502 to a degree sufficient to manipulate a wafer within various load ports 506, semiconductor processing chambers 510, and/or defect sensor orientator 502. The defect sensor orientator 502 may be located at around a center part of the first transfer chamber 504. However, in other embodiments, a defect sensor orientator may also, or instead, be located in the second transfer chamber 508, a load port 506, and/or a semiconductor processing chamber 510.

The semiconductor processing chambers 510 may include any semiconductor processing chamber for receipt and processing of a wafer or other semiconductor workpiece. Example processes that may be performed in these semiconductor processing chambers include processes related to physical vapor deposition (PVD), chemical vapor deposition (CVD), chemical mechanical planarization (CMP), diffusion (DIF), wet etching, dry etching, photolithography, after developed inspection (ADI), after etched inspection (AEI), critical dimension (CD) inspection, scanning electron microscope (SEM) inspection, critical dimension scanning electron microscope (CD-SEM) inspection, wet cleaning, dry cleaning, and plasma etching.

Figure 5B:
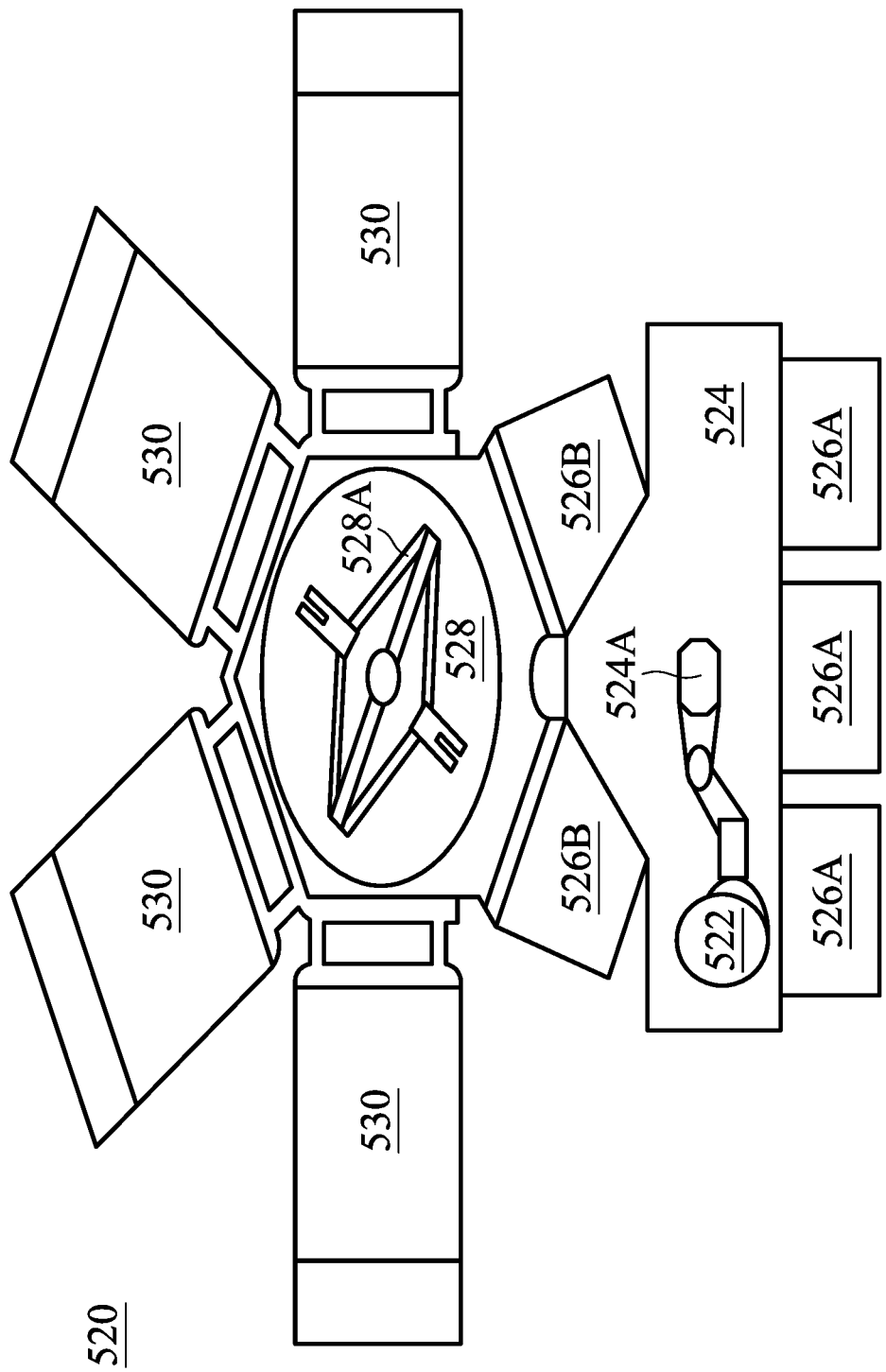
FIG. 5B is an illustration of a workstation with a defect sensor orientator located toward a side of a transfer chamber, in accordance with some embodiments.

FIG. 5B is an illustration of a workstation 520 with a defect sensor orientator 522 located toward a side of a first transfer chamber 524, in accordance with some embodiments. The workstation 520 may also include load ports 526A, 526B, a second transfer chamber 528, and various semiconductor processing chambers 530. The first transfer chamber 524 may include a robotic arm 524A and be configured to transfer wafers among the load ports 526A, 526B and the defect sensor orientator 522. The second transfer chamber 528 may include a robotic arm 528A and be configured to transfer wafers among the semiconductor processing chambers 530 and the load ports 526B. The robotic arms 524A, 528A may be movable and/or extendable between the various load ports 526A. 526B, semiconductor processing chambers 530 and/or defect sensor orientator 522 to a degree sufficient to manipulate a wafer within various load ports 526A, 526B, semiconductor processing chambers 530, and/or defect sensor orientator 522. The defect sensor orientator 522 may be located at around a side part of the first transfer chamber 524. However, in other embodiments, a defect sensor orientator may also, or instead, be located in the second transfer chamber 528, load ports 526A, 526B, and/or semiconductor processing chambers 530

Figure 5C:
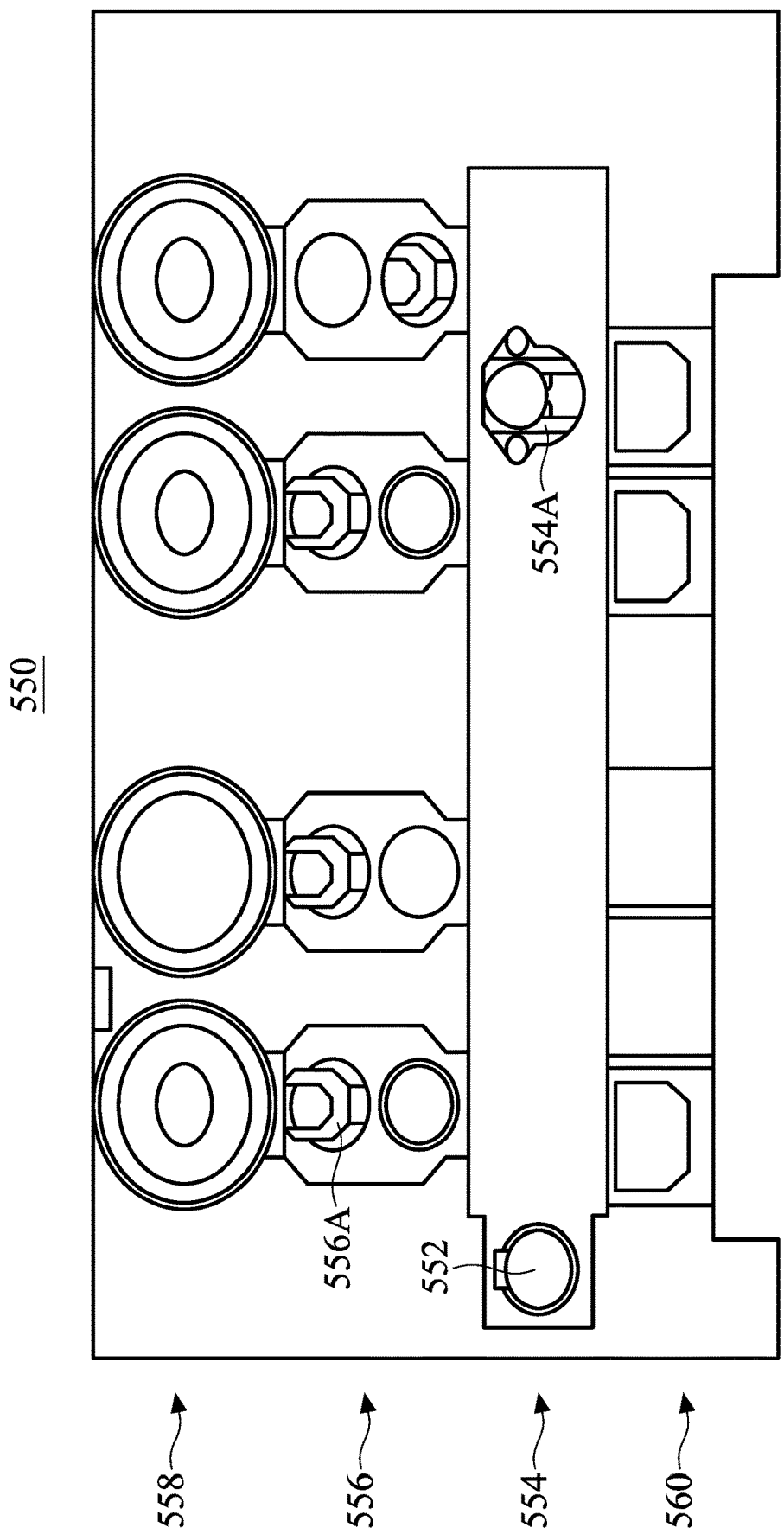
FIG. 5C is an illustration of a workstation with a defect sensor orientator located toward a far side of a transfer chamber, in accordance with some embodiments.

FIG. 5C is an illustration of a workstation 550 with a defect sensor orientator 552 located toward a far side of a transfer chamber 554, in accordance with some embodiments. By being on a far side of a transfer chamber 554, a robotic arm may not need to reach around or move around the defect sensor orientator 552 when handling wafers or other materials. However, in other embodiments, a defect sensor orientator may also, or instead, be located in a load port 556. Processing chamber 558, and/or outer load port 560.

The workstation 550 may have individual load ports 556 for each semiconductor processing chamber 558, in accordance with some embodiments. The workstation 550 may include four semiconductor processing chambers 558, which are each interfaced with an individual load port 556. Each individual load port 556 may have a robotic arm 556A with which to move a wafer between a respective semiconductor processing chamber 558 and individual load port 556 and/or the transfer chamber 554. The transfer chamber 554 may include a robotic arm 554A which may move within the transfer chamber 554 and transfer wafers among various load ports 556 and outer load ports 560. By having a robotic arm 556A within each individual load port 556, another transfer chamber adjacent the semiconductor processing chambers 558 may not be necessary as the robotic arm 556A within the load port 556 may directly transfer a wafer between a respective semiconductor processing chamber 558 and the load port 556 and/or the transfer chamber 554.

FIG. 6 is a block diagram of various functional modules of a defect sensor orientator system 602, in accordance with some embodiments. The defect sensor orientator system 602 may include a defect orientator, as discussed above. The defect sensor orientator system 602 may include a processor 604. In further embodiments, the processor 604 may be implemented as one or more processors.

The processor 604 may be operatively connected to a computer readable storage module 606 (e.g., a memory and/or data store), a network connection module 608, a user interface module 610, a controller module 612, and a sensor module 614. In some embodiments, the computer readable storage module 606 may include defect orientator operation logic that may configure the processor 604 to perform the various processes discussed herein. The computer readable storage 606 may also store data, such as sensor data characterizing wafer defects, control instructions for an orientator and/or robotic arm to orient a wafer in accordance with an orientation fiducial and/or to facilitate defect sensor data collection, identifiers for a wafer, identifiers for a defect sensor orientator, identifiers for a semiconductor workpiece fabrication process, and any other parameter or information that may be utilized to perform the various processes discussed herein.

The network connection module 608 may facilitate a network connection of the defect sensor orientator system 602 with various devices and/or components of the defect sensor orientator system 602 that may communicate (e.g., send signals, messages, instructions, or data) within or external to the defect sensor orientator system 602. In certain embodiments, the network connection module 608 may facilitate a physical connection, such as a line or a bus. In other embodiments, the network connection module 608 may facilitate a wireless connection, such as over a wireless local area network (WLAN) by using a transmitter, receiver, and/or transceiver. For example, the network connection module 608 may facilitate a wireless or wired connection with the processor 604 and the computer readable storage 606.

The defect sensor orientator system 602 may also include the user interface module 610. The user interface may include any type of interface for input and/or output to an operator of the defect sensor orientator system 602, including, but not limited to, a monitor, a laptop computer, a tablet, or a mobile device, etc.

The defect sensor orientator system 602 may include a controller module 612. The controller module 612 may be configured to control various physical apparatuses that control movement or functionality for a robotic arm, orientator, defect sensor, defect sensor orientator, processing chamber, or any other controllable aspect of a defect sensor orientator system. For example, the controller module 612 may be configured to control movement or functionality for at least one of a door of the chamber, a rotational motor that rotates an orientator around an axis of rotation, and the like. For example, the controller module 612 may control a motor or actuator. The controller may be controlled by the processor and may carry out the various aspects of the various processes discussed herein.

The sensor module 614 may represent a defect sensor and/or orientation sensor configured to collect sensor data. As discussed above, in certain embodiments an orientation sensor may include an emitter and detector pair in which an emitter emits detectible radiation (e.g., a laser beam) which is detected by a detector. For example, the radiation may be detectible only at a location along the wafer's bezel where there is an orientation fiducial, such as a notch or a flat. In particular embodiments, a center sensor may be utilized to detect whether a wafer is centered on a pedestal, such as at an axis of rotation. For example, the center sensor may be configured to detect a location of a center fiducial (e.g., a fiducial at a center of a wafer) or may be determined to determine distances between the center of rotation to the periphery of the wafer along a linear path so that a wafer center point offset may be calculated by geometric analysis of the measurements.

Also, as discussed above, a defect sensor orientator may include defect sensors. These defect sensors may be configured to collect sensor data as the defect sensor orientator performs processes related to wafer orientation using the orientation sensor. For example, a top defect sensor may be configured to detect wafer defects along a top of a wafer (e.g., within a scanning region of the top defect sensor). A bevel defect sensor may be configured to detect wafer defects along a side or bevel of the wafer (e.g., within a scanning region of the bevel defect sensor). A bottom defect sensor may be configured to detect wafer defects along a bottom of a wafer (e.g., within a scanning region of the bottom defect sensor). In certain embodiments, the scanning regions of these sensors may overlap, such as an overlap between the scanning region of the bottom defect sensor and the scanning region of the bevel defect sensor. In particular embodiments, the scanning regions may refer to a field of view, such as where the defect sensors are optical sensors (e.g., a charge coupled device (CCD), complementary metal-oxide-semiconductor (CMOS) or N-type metal-oxide semiconductor (NMOS) image sensors). In additional embodiments, the defect sensors may a scanning electron microscope (SEM) or other type of sensor that may be utilized to detect defects along a surface of the wafer 108.

Figure 7:
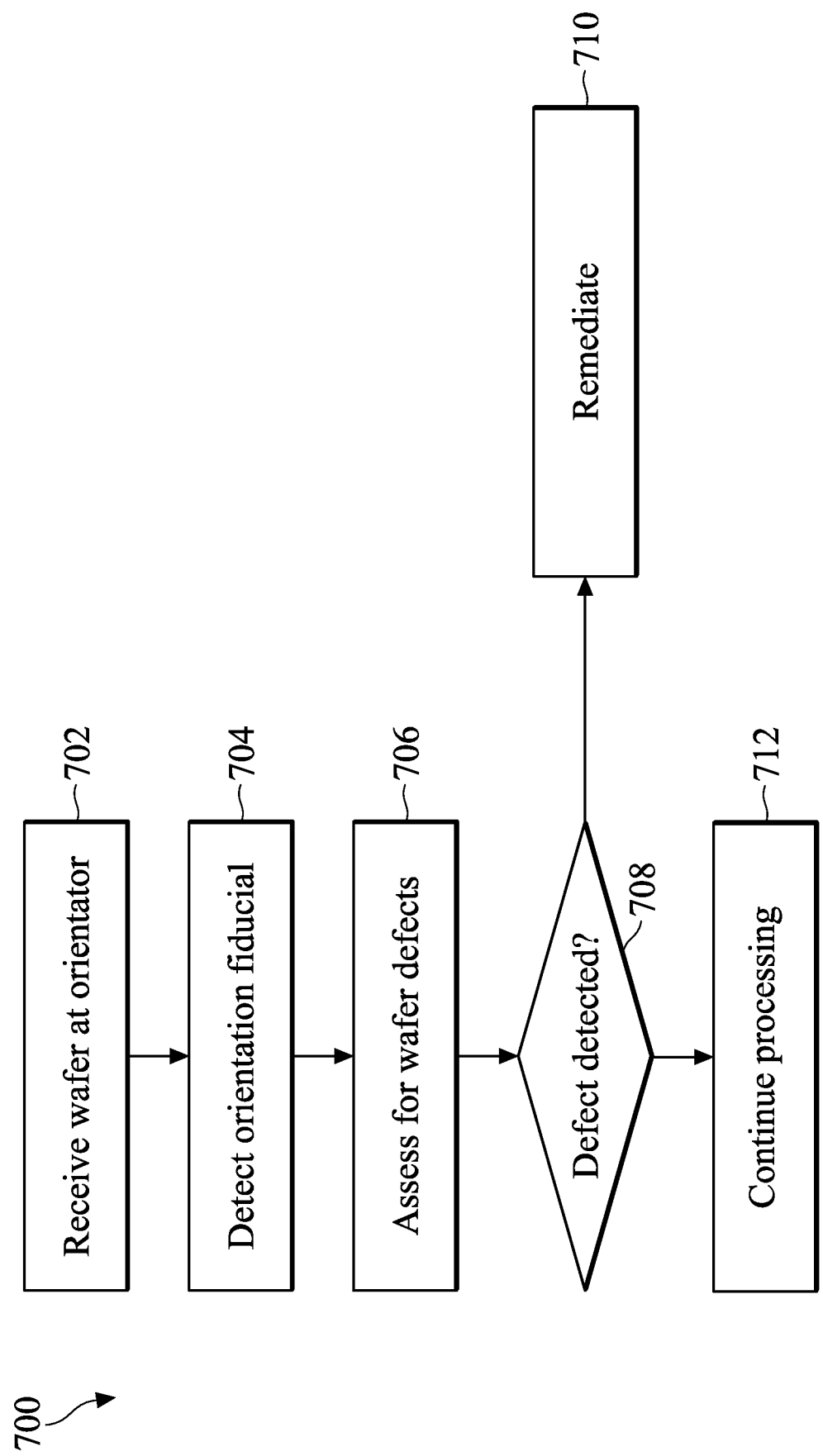
FIG. 7 is a flow chart of a defect sensor orientator process, in accordance with some embodiments.

FIG. 7 is a flow chart of a defect sensor orientator process 700, in accordance with some embodiments. The defect sensor orientator process 700 may be performed by a modular defect sensor orientator system with a defect sensor orientator, as discussed above. It is noted that the process 700 is merely an example, and is not intended to limit the present disclosure. Accordingly, it is understood that additional operations may be provided before, during, and after the process 700 of FIG. 7, certain operations may be omitted, certain operations may be performed concurrently with other operations, and that some other operations may only be briefly described herein.

At operation 702, a wafer may be received at a defect sensor orientator. The wafer may be received by being placed on a wafer pedestal by a robotic arm. The robotic arm may be specific for the purpose of placing the wafer on a pedestal of the defect sensor orientator. In other embodiments, the robotic arm may be part of a transfer chamber, a load port, or any other component of a workstation. Stated another way, the robotic arm may have functionalities other than placing the wafer on the defect sensor orientator and/or orientating or orientating the wafer on the pedestal in a desired manner.

At operation 704, an orientation fiducial may be detected on the wafer placed on the pedestal. As discussed above, the orientation fiducial may be detected by an orientation sensor with an emitter and detector pair. The emitter may emit detectible radiation (e.g., a laser beam) which is detected by the detector. For example, the radiation may be detectible only at a location along the wafer's bezel where there is an orientation fiducial, such as a notch or a flat. The pedestal may rotate while the orientation fiducial is collecting sensor data for the characterization of the orientation fiducial. In certain embodiments, the pedestal may be configured to rotate 360 degrees in order for the orientation sensor to locate the orientation fiducial. In other embodiments, the pedestal may rotate the wafer incrementally until the orientation fiducial is found, detected, or located. Once the orientation fiducial is located, pedestal may rotate the wafer to a particular angular position (e.g., so that the orientation fiducial, or any other distinguishable part of the wafer, is at a predetermined orientation position), based on or relative to the orientation fiducial, for the robotic arm to retrieve the wafer. The particular angular position may be a desired end or final orientation of the wafer for further processing of the wafer within the workstation.

At operation 706, wafer defects may be assessed using defect sensors on the defect sensor orientator. As discussed above, the defect sensors may be configured to operate concurrently with operation of the pedestal (e.g., as the pedestal turns) and/or concurrently with operation of the orientation sensor. Accordingly, in certain embodiments, operation 706 may be performed concurrently with operation 704. However, in other embodiments, operation 706 may be performed before and/or after operation 704, such as where an orientation fiducial is detected before or after assessment for wafer defects.

As introduced above, wafer defects may include any type of defect detectible by the defect sensor which may reduce wafer fabrication yield, such as a crack, discoloration, scratch, peel, and/or a chip on a wafer. Wafer defect detection may be accomplished through the utilization of wafer defect detection techniques, such as by the detection of non-uniformities, outliers, and/or variances as detected within collected sensor data. For example, wafer defect detection techniques may assess image data (e.g., image data of multiple images, or a video) captured of a wafer as the wafer spins. Different frames or discrete parts (e.g., images or parts of images) of the image data may be compared to determine the presence of defects as abnormalities or outliers in the image data. For example, edge detection, thresholding, color based segmentation, or other types of image segmentation techniques may be utilized to find various features in the image data. Then, based on comparing the detected features, outliers in the data may be determined as possible wafer defects via supervised or unsupervised learning. The determination or definitions of outliers may be made in accordance with conventional statistical analysis for outliers. In certain embodiments, conventional wafer defect detection techniques may be utilized for the detection of wafer defects and thus will not be discussed in detail herein.

At operation 708, a decision may be made as to whether a wafer defect is detected. If a defect is detected, the defect sensor orientator process 700 may proceed to operation 710. If a defect is not detected, the defect sensor orientator process 700 may proceed to operation 712.

At operation 710, remediation may be performed based on the detection of the wafer defect. The remediation may include pausing the processing of the wafer pending a remediation (e.g., a fix) and/or removing the wafer from processing in favor of processing another wafer without the defect (e.g., a restart). In certain embodiments, the process of wafer processing may be paused pending removal of the wafer using the robotic arm. Once the defective wafer (e.g., the wafer with the wafer defect) is removed, the defect sensor orientator process 700 may begin again at operation 702 with a new wafer. In certain embodiments, remediation may be performed at the defect sensor orientator without removal of the wafer. For example, where the wafer defect may be a deposition of an undesirable artifact on the wafer's surface, a fan or a blow may be activated at the defect sensor orientator to use air or gas to push off the undesirable artifact on the wafer's surface to facilitate resumption of wafer processing (e.g., proceed to operation 712).

At operation 712, wafer processing may be continued should no defects be detected or if wafer defects are sufficiently remediated. For example, wafer processing may continue by orienting the wafer using the pedestal based on the detected orientation fiducial and removing the wafer from the pedestal using the robotic arm for transport within a workstation.

In an embodiment, a system includes: an orientation sensor configured to detect an orientation fiducial on a bevel of a wafer; a pedestal configured to rotate the wafer to allow the orientation sensor to detect the orientation fiducial and place the orientation fiducial at a predetermined orientation position; and a defect sensor configured to detect a wafer defect along a surface of the wafer while rotated by the pedestal.

In another embodiment, a system includes: an orientation sensor configured to detect an orientation fiducial on a bevel of a wafer; a pedestal configured to rotate the wafer to allow the orientation sensor to detect the orientation fiducial and place the orientation fiducial at a predetermined orientation position; a defect sensor configured to detect a wafer defect along a surface of the wafer while rotated by the pedestal; and a robotic arm configured to: deposit the wafer on the pedestal, and remove the wafer from the pedestal when the orientation fiducial is at the predetermined orientation position.

In another embodiment, a method includes: rotating a wafer using a pedestal; detecting an orientation fiducial on a bevel of the wafer; rotating the wafer, using the pedestal, to a predetermined orientation position based on the orientation fiducial; and scanning for defects along a surface of the wafer while the wafer is rotated using the pedestal.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   an orientation sensor configured to detect an orientation fiducial on a wafer;
   a pedestal configured to:
      rotate the wafer while the orientation sensor inspects the wafer for the orientation fiducial, and
      place the orientation fiducial at a predetermined orientation position;
   a first defect sensor configured to detect a wafer defect along a surface of the wafer while rotated by the pedestal;
   and
   a center sensor configured to detect whether the wafer is centered on the pedestal by detecting a center fiducial provided on the wafer.

2. The system of claim 1, wherein the pedestal is configured to support a bottom surface of the wafer, and the first defect sensor is configured to detect wafer defects along the bottom surface of the wafer.

3. The system of claim 1, wherein the first defect sensor is configured to detect wafer defects along the bevel of the wafer.

4. The system of claim 1, wherein the first defect sensor is configured to detect wafer defects along a top surface of the wafer.

5. The system of claim 1, wherein the first defect sensor comprises one of a charge coupled device (CCD) or a scanning electron microscope (SEM).

6. The system of claim 1, further comprising a second defect sensor, wherein the first and second defect sensors are each configured to detect defects in overlapping regions of the first surface of the wafer.

7. The system of claim 1, wherein the orientation fiducial is a notch or a flat.

8. A system, comprising:
   an orientation sensor configured to detect an orientation fiducial on wafer;
      a pedestal configured to rotate the wafer while the orientation sensor inspects the wafer for the orientation fiducial;
   a first defect sensor configured to detect a wafer defect along a surface of the wafer while rotated by the pedestal;
   a center sensor configured to detect whether the wafer is centered on the pedestal by detecting a center fiducial provided on the wafer; and
   a robotic arm configured to:
      deposit the wafer on the pedestal, and
      remove the wafer from the pedestal.

9. The system of claim 8, further comprising a second defect sensor, wherein the first and second defect sensors are each configured to detect defects in overlapping regions of the surface of the wafer.

10. The system of claim 9, wherein the pedestal is configured to rotate the wafer 360 degrees.

11. The system of claim 9, wherein the pedestal is configured to support a bottom surface of the wafer, and the first and second defect sensors are each configured to detect wafer defects along the bottom surface of the wafer.

12. The system of claim 9, wherein the first and second defect sensors are each configured to detect wafer defects along a bevel of the wafer.

13. The system of claim 9, wherein the first and second defect sensors are each configured to detect wafer defects along a top surface of the wafer.

14. The system of claim 9, wherein the first defect sensor comprises a charge coupled device (CCD) and the second defect sensor comprises a scanning electron microscope (SEM).

15. A method, comprising:
    rotating a wafer using a pedestal;
    detecting an orientation fiducial on the wafer while the wafer is rotated using the pedestal;
    rotating the wafer, using the pedestal, to a predetermined orientation position based on the orientation fiducial;
    simultaneously scanning for defects along a surface of the wafer while the wafer is rotated using the pedestal using at least two different types of defect sensors; and
    detecting whether the wafer is centered on the pedestal using a center sensor configured to detect a location of a center fiducial provided on the wafer.

16. The method of claim 15, further comprising moving the wafer to the pedestal using a robotic arm.

17. The method of claim 16, further comprising removing the wafer from the pedestal when the wafer is at the predetermined orientation position.

18. The method of claim 15, wherein the surface is a bottom surface of the wafer.

19. The method of claim 15, wherein the surface is a bevel of the wafer.

20. The method of claim 15, wherein the surface is a top surface of the wafer.

\* \* \* \* \*